(12) United States Patent
Wellig et al.

(10) Patent No.: US 7,900,097 B2
(45) Date of Patent: Mar. 1, 2011

(54) METHOD OF DE-INTERLEAVING INTERLEAVED DATA SAMPLES SEQUENCES, AND ASSOCIATED SYSTEM

(75) Inventors: Armin Wellig, Nyon (CH); Julien Zory, Fernay Voltaire (FR)

(73) Assignee: STMicroelectronics N.V., Amsterdam (NL)

( * ) Notice: Subject to any disclaimer, the term of this patent is extended or adjusted under 35 U.S.C. 154(b) by 216 days.

(21) Appl. No.: 12/355,899

(22) Filed: Jan. 19, 2009

(65) Prior Publication Data

US 2009/0221318 A1  Sep. 3, 2009

Related U.S. Application Data

(62) Division of application No. 11/007,114, filed on Dec. 8, 2004, now Pat. No. 7,506,220.

(30) Foreign Application Priority Data

Dec. 9, 2003 (EP) .................................. 03293075

(51) Int. Cl.
*G06F 11/00* (2006.01)
*G11C 29/00* (2006.01)
(52) U.S. Cl. ........................ 714/701; 714/702
(58) Field of Classification Search .................. 714/701, 714/702
See application file for complete search history.

(56) References Cited

U.S. PATENT DOCUMENTS

| | | | | |
|---|---|---|---|---|
| 6,603,412 B2* | 8/2003 | Gatherer et al. | ................ | 341/61 |
| 6,678,843 B2* | 1/2004 | Giulietti et al. | ............... | 714/701 |
| 6,798,826 B1* | 9/2004 | Shiu et al. | ..................... | 375/147 |
| 7,200,181 B2* | 4/2007 | Kim et al. | ..................... | 375/262 |
| 2003/0014700 A1* | 1/2003 | Giulietti et al. | ............... | 714/701 |
| 2003/0099217 A1 | 5/2003 | Castor et al. | .................. | 370/335 |
| 2003/0128722 A1 | 7/2003 | Woodard | ..................... | 370/536 |

FOREIGN PATENT DOCUMENTS

WO  02/100054  12/2002

OTHER PUBLICATIONS

3GPP TW 25.212 V3.4.0, Multiplexing and Channel Coding (FDD), vol. 3.4.0, Sep. 2000, pp. 1-62.

* cited by examiner

*Primary Examiner* — Joseph D Torres
(74) *Attorney, Agent, or Firm* — Lisa K. Jorgenson; Allen, Dyer, Doppelt, Milbrath & Gilchrist, P.A.

(57) ABSTRACT

A method for de-interleaving S2 received sequences of interleaved received data samples respectively issued from S2 physical channels and to be associated with S1 output transport channels is provided. The S2 received sequences have been delivered, before transmission by a two-stage multi-interleaving device, from S1 initial sequences of ordered data samples respectively associated to S1 initial transport channels. The two-stage multi-interleaving device includes a first stage including S1 interleaving blocks respectively associated to the S1 initial transport channels, a second stage including S2 interleaving blocks respectively associated to the S2 physical channels, and an inter-stage of predetermined data-routing functions connected between the first and second stages.

16 Claims, 4 Drawing Sheets

METHOD OF DE-INTERLEAVING INTERLEAVED DATA SAMPLES SEQUENCES, AND ASSOCIATED SYSTEM

RELATED APPLICATION

This application is a divisional of Ser. No. 11/007,114 filed Dec. 8, 2004, now U.S. Pat. No. 7,506,220 the entire disclosure of which is hereby incorporated herein by reference.

FIELD OF THE INVENTION

The invention relates in general to de-interleaving sequences of interleaved data samples. An application of the invention is directed in general to wireless communication systems, and more particularly, to CDMA systems such as the different CDMA based mobile radio systems including the 3GPP systems operating in accordance with the well-known 3GPP standard.

BACKGROUND OF THE INVENTION

An interleaving device is, in particular, located between a channel encoder and a modulator within a transmitter. In the same way, a de-interleaving device is located between a demodulator and a channel decoder within a receiver.

Interleaving scrambles the processing order to break up neighbor relations in successive data samples, and de-interleaving brings them into the original sequences again. Current de-interleaving approaches present several problems, notably a high memory access rate, a memory re-use bottleneck, and no scalability.

SUMMARY OF THE INVENTION

An object of the invention is to de-interleave data samples interleaved by a two-stage multi-interleaving device, without using a traditional de-interleaving method, in order to reduce a de-interleaving multi-stage problem into a one-stage problem. This significantly reduces the necessary memory size and memory access rate, which in turn, greatly impacts the overall die area and power consumption.

This and other objects, advantages and features in accordance with the invention is provided by an efficient transformation of a two-stage block interleaving subsystem comprising respectively S1 and S2 interleavers per stage. The processing may include writing data samples row by row, performing inter-columns permutations, and reading out data samples column by column. The interleavers may be connected through inter-stage data-routing functions into a one-stage representation requiring fewer resources and data routing to provide an area-efficient, low power approach.

A method for de-interleaving S2 received sequences of interleaved received data samples respectively issued from S2 physical channels, and which are able to be associated with S1 output transport channels is provided. The S2 received sequences have been delivered, before transmission, by a two-stage multi-interleaving device, from S1 initial sequences of ordered data samples respectively associated to S1 initial transport channels. The two-stage multi-interleaving device comprises a first stage including S1 interleaving blocks respectively associated to the S1 initial transport channels, a second stage including S2 interleaving blocks respectively associated to the S2 physical channels, and an inter-stage of predetermined data-routing functions connected between the first and second stages. The method may comprise the following steps:

a) for each of the S2 received sequences, determining for each output transport channel the number $N_{s_2}^{col(s_1)}$ of received data samples of the sequence belonging to the output transport channel, and calculating, for each received data sample belonging to the output transport channel, its rank in the sequence of data samples associated to the output transport channel, the rank being identical to the rank of the corresponding data sample in the corresponding initial sequence associated to the corresponding initial transport channel;

b) storing each data for which its rank has been calculated, in a memory element associated to the corresponding output transport channel, taking into account its calculated rank; and c) when all the S2 received sequences have been processed, reading each memory element such that the stored data samples are successively read in the same order as the order of the initial sequences of ordered data samples.

In one embodiment, step a) may comprise, for a received sequence associated to a determined physical channel, successively considering the S1 output transport channels a number of times equal to the number of columns of the interleaving block of the second stage associated to the physical channel.

In a preferred embodiment, the number $N_{s_2}^{col(s_1)}$ is determined from data including the number of columns of the interleaving block of the second stage associated to the considered physical channel, the number of rows of the interleaving block of the first stage of the initial transport channel corresponding to the considered output transport channel and a predetermined value U associated to each physical channel, where U denotes the number of bits in one (radio) frame (which in turn corresponds to transmitting "one interleaver column" worth of data samples of each of the S1 Transport channel). The determining step may comprise taking into account a concatenation order of the initial transport channels.

In one embodiment, the calculating step comprises:
for the number $N_{s_2}^{col(s_1)}$ of data samples belonging to a considered output transport channel, calculating a value C and a phase term p, which are constant for the number $N_{s_2}^{col(s_1)}$ of data samples;
the value C being equal to the product of the number of columns of the interleaving block of the second stage associated to the considered physical channel, and of the number of columns of the interleaving block of the first stage of the initial transport channel corresponding to the considered output transport channel; and
the phase term p depending from the number of columns of the interleaving block of the second stage associated to the considered physical channel, the number of columns of the interleaving block of the first stage of the initial transport channel corresponding to the considered output transport channel, a first permutation function of columns of the interleaving block of the first stage of the initial transport channel corresponding to the considered output transport channel, a second permutation of columns of the interleaving block of the second stage of the physical channel, and of the predetermined value U.

In a preferred embodiment, the rank of a data sample is equal to p+k*C, where k is an incremental value varying from 0 to $N_{s_2}^{col(s_1)}-1$. Thus, according to an embodiment of the invention, a pseudorandom block interleaved sequence can be grouped into packets that are uniquely defined by a start address p, a pseudo constant value C, and a packet size of k samples varying from 0 to $N_{s_2}^{col(s_1)}-1$, and only three parameters need to be stored to select k data samples.

In one embodiment, interleaving and de-interleaving steps may be performed according to the 3GPP standard, with inter-stage data-routing functions comprising columns permutation functions, initial transport channels permutation functions, segmentation functions, concatenation functions, padding functions, and unpadding functions.

According to the invention, a system de-interleaves S2 received sequences of interleaved received data samples respectively issued from S2 physical channels, and which are to be associated with S1 output transport channels. The S2 received sequences have been delivered, before transmission, by a two-stage multi-interleaving device, from S1 initial sequences of ordered data samples respectively associated to S1 initial transport channels. The two-stage multi-interleaving device may comprise a first stage including S1 interleaving blocks respectively associated to the S1 initial transport channels, a second stage including S2 interleaving blocks respectively associated to the S2 physical channels and an inter-stage of predetermined data-routing functions connected between the first and second stages. The system comprises:

a process or a determining unit for determining, for each of the S2 received sequences, and for each output transport channel, the number $N_{s_2}^{col(s_1)}$ of received data samples of the sequence belonging to the output transport channel, and a calculation unit for calculating, for each of the S2 received sequences, and for each received data sample belonging to the output transport channel, its rank in the sequence of data samples associated to the output transport channel, the rank being identical to the rank of the corresponding data sample in the corresponding initial sequence associated to the corresponding initial transport channel;

S1 memory elements respectively associated to the S1 output transport channels (instead of S1+S2 memory elements in a traditional approach);

a storage device for storing each data for which its rank has been calculated, in the memory element associated to the corresponding output transport channel; and a reader for reading, when all the S2 received sequences have been processed, each memory element such that the stored data samples are successively read in the same order as the order of the initial sequences of ordered data samples.

In a preferred embodiment, the determining is adapted for successively considering the S1 output transport channels a number of times equal to the number of columns of the interleaving block of the second stage associated to the physical channel for a received sequence associated to a determined physical channel.

In one embodiment, the determining unit may determine the number $N_{s_2}^{col(s_1)}$ from data including the number of columns of the interleaving block of the second stage associated to the considered physical channel, the number of rows of the interleaving block of the first stage of the initial transport channel corresponding to the considered output transport channel and a predetermined value U associated to each physical channel. The determining takes into account a concatenation order of the initial transport channels.

In a preferred embodiment, the calculating unit may calculate a value C and a phase term p, which are constant for the number $N_{s_2}^{col(s_1)}$ of data samples. The value C is equal to the product of the number of columns of the interleaving block of the second stage associated to the considered physical channel and of the number of columns of the interleaving block of the first stage of the initial transport channel corresponding to the considered output transport channel. The phase term p depends from the number of columns of the interleaving block of the second stage associated to the considered physical channel, the number of columns of the interleaving block of the first stage of the initial transport channel corresponding to the considered output transport channel, a first permutation function of columns of the interleaving block of the first stage of the initial transport channel corresponding to the considered output transport channel, a second permutation of columns of the interleaving block of the second stage of the physical channel, and of the predetermined value U.

In another embodiment, the calculating unit may calculate the rank of a d data sample equal to p+k*C, where k is an incremental counter varying from 0 to $N_{s_2}^{col(s_1)}-1$.

In one embodiment, the system may perform according to the 3GPP standard, for interleaving and de-interleaving, with inter-stage data-routing functions comprising columns permutation functions, initial transport channels permutation functions, segmentation functions, concatenation functions, padding functions, and unpadding functions.

Another aspect of the invention is directed to a receiving apparatus incorporating a de-interleaving system as above defined.

BRIEF DESCRIPTION OF THE DRAWINGS

Other advantages and features of the invention will appear on examining the detailed description of embodiments, these being in no way limiting, and of the appended drawings in which.

DETAILED DESCRIPTION OF THE PREFERRED EMBODIMENTS

Figure 1:
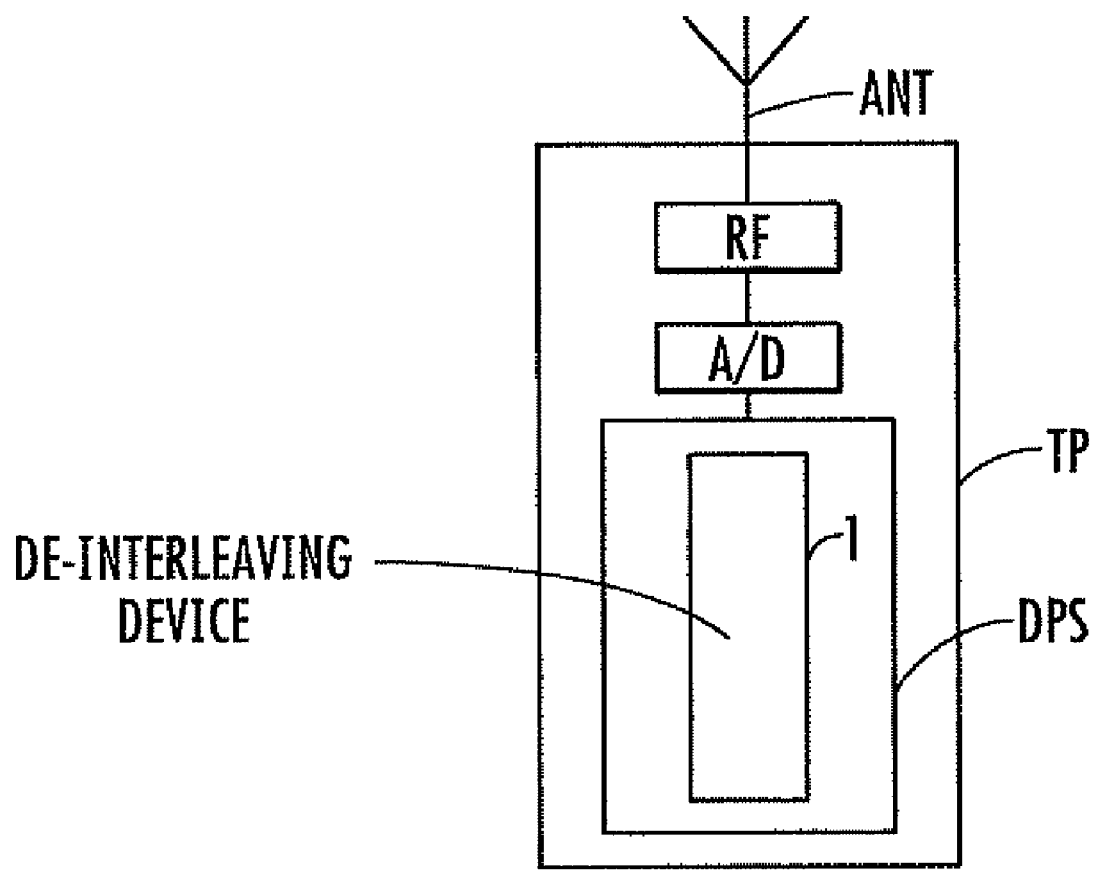
FIG. 1 shows a cellular mobile phone with a system according to the invention.

Referring now FIG. 1, a de-interleaving system according to the invention is illustrated, which is incorporated in the reception chain of a cellular mobile phone TP. However, the invention is not limited to this particular application.

The interleaved signal is received by the antenna ANT and processed by the radio frequency stage RF of the receiver. At the output of the RF stage, the signal is converted into the digital domain by an A/D converter. The converted signal is transmitted to a digital process stage DPS which comprises a system 1 of de-interleaving according to the invention, and processes the digital baseband signal.

Figure 2:
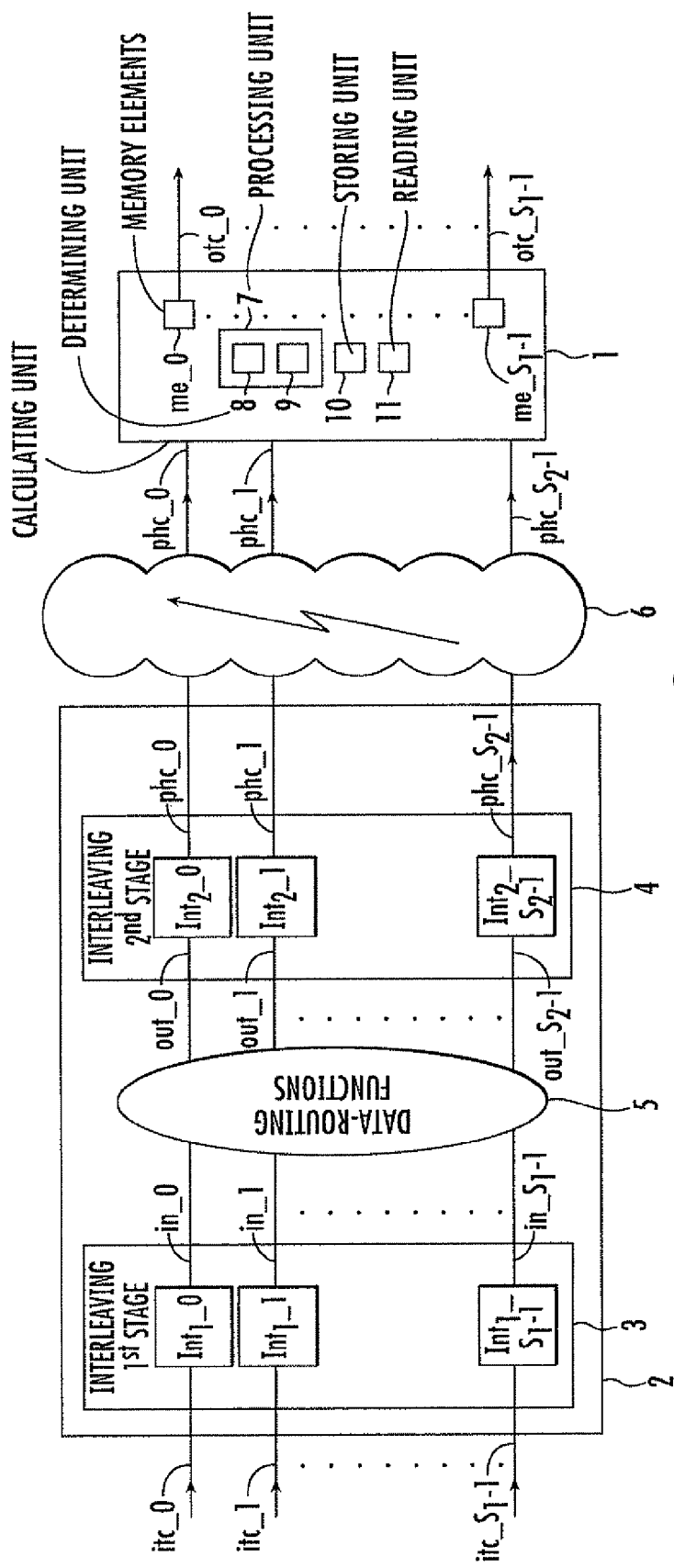
FIG. 2 illustrates a two-stage multi-interleaving transmit unit according to the 3GPP standard with inter-stage data-routing functions, and a de-interleaving receive unit according to the invention.

Referring now to FIG. 2, a two-stage multi-interleaving device 2 is represented. This term means a device with two stages, each stage having a plurality of interleavers. The two-stage multi-interleaving device 2 comprises a first interleaving stage 3, a second interleaving stage 4, and an inter-stage of predetermined data-routing functions 5 connected between the first and second stages. A data-routing function manipulates the order of data samples, but does not change their values.

The two-stage multi-interleaving device 2 comprises, at its input, S1 initial transport channels itc_0, itc_1, ..., itc_S1-1 linked to S1 respective interleaving blocks Int1_0, Int1_1, . . . , Int1_S1-1. The S1 interleaving blocks Int1_0, Int1_1, . . . , Int1_S1-1 are linked to the data-routing predetermined functions inter-stage by the S1 connections in_0, in_1, . . . , in_S1-1. The second stage comprises S2 interleaving blocks Int2_0, Int2_1, . . . , Int2_S2-1 respectively connected to the data-routing predetermined functions inter-stage by the S2 connections out_0, out_1, . . . , out_S2-1.

The S2 interleaving blocks Int2_0, Int2_1, . . . , Int2_S2-1 of the second stage are respectively linked with S2 respective physical channels phc_0, phc_1, . . . , phc_S2-1, which transmit data samples over the air interface 6.

The de-interleaving system 1 receives interleaved data samples by the S2 physical channels phc_0, phc_1, . . . , phc_S2-1, and outputs de-interleaved data samples by S1 output transport channels otc_0, otc_1, . . . , otc_S1-1 respectively corresponding to the S1 initial transport channel itc_0, itc_1, . . . , itc_S1-1 of the first stage 3 of the two-stage multi-interleaving device 2.

The de-interleaving system 1 further comprises a processing unit 7 that comprises a determining unit 8 and a calculating unit 9. The de-interleaving system 1 comprises S1 memory elements me_0, me_1, . . . , me_S1-1 respectively associated to the S1 output transport channels otc_0, otc_1, . . . , otc_S1-1. Furthermore, the de-interleaving system 1 comprises a storing unit 10, and a reading unit 11.

Sequences of data samples interleaved by the two-stage multi-interleaving device 2 are received in a respective determined order by the S1 initial transport channels itc_0, itc_1, . . . , itc_S1-1. The sequence is stored row by row in the first-stage corresponding interleaving block Int1_0, Int1_1, . . . , Int1_S1-1. The first-stage interleaving blocks Int1_0, Int1_1, . . . , Int1_S1-1 are respectively read out column by column by the data-routing predetermined functions inter-stage 5, and corresponding read data samples are transmitted by the respective connections in_0, in_1, . . . , in_S1-1.

Figure 3:
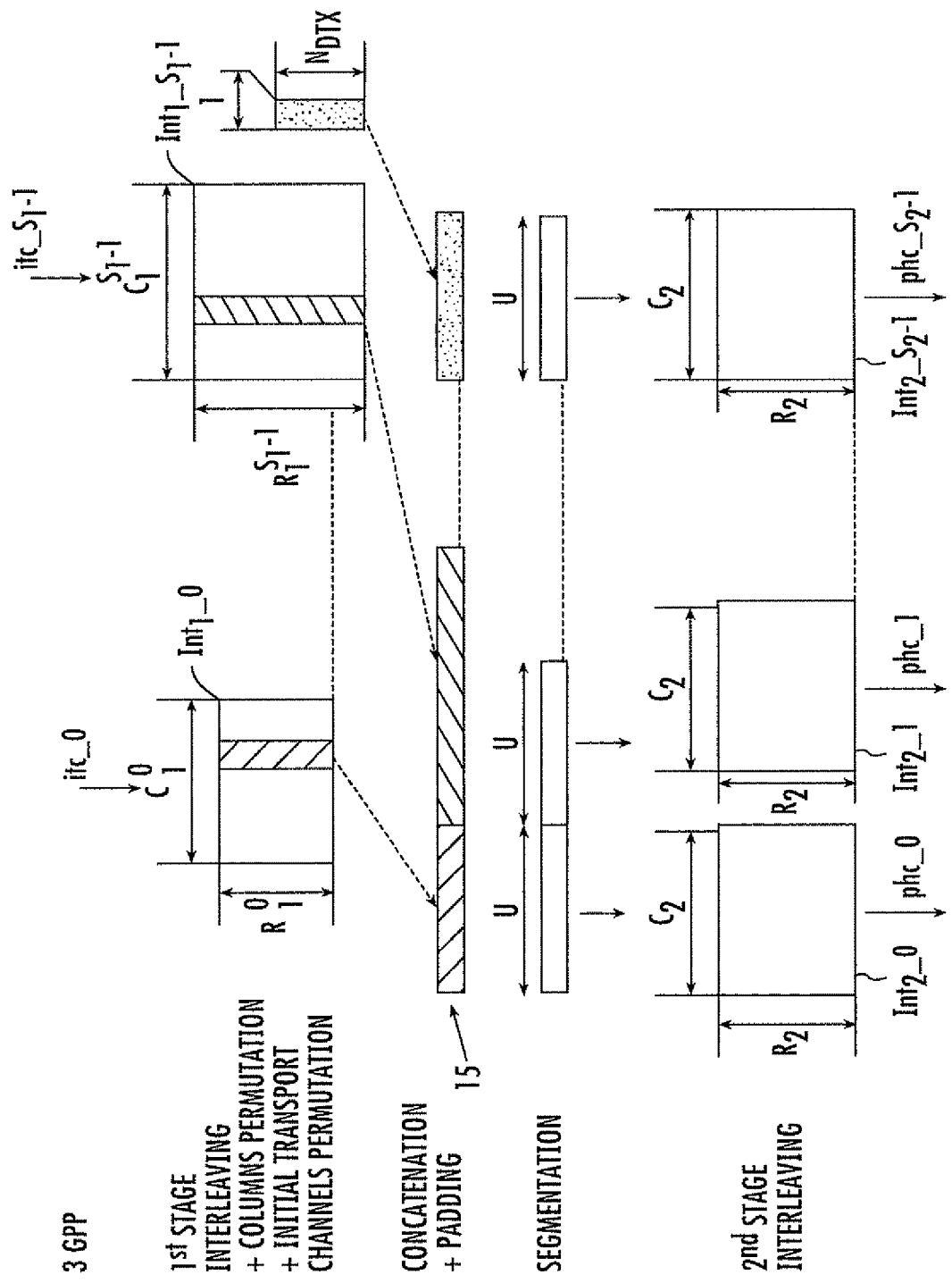
FIG. 3 shows a data flow corresponding to a two-stage multi-interleaving transmit unit with inter-stage data-routing functions according to the 3GPP standard.

For example, in the 3GPP standard, inter-stage data-routing functions comprise column permutation functions to read columns of a first-stage interleaving block in a determined order, concatenation functions for concatenating data samples read by columns in the first-stage interleaving blocks Int1_0, Int1_1, . . . , Int1_S1-1 in first-stage interleaving blocks order determined by transport channels permutation functions. Data-routing functions also comprise padding functions and segmentation functions. An example in 3GPP standard is illustrated in FIG. 3.

The processed data samples are then transmitted to the S2 second-stage interleaving blocks Int2_0, Int2_1, . . . , Int2_S2-1 by the respective connections out_0, out_1, . . . , out_S2-1, and the data samples are stored row by row in the respective S2 second-stage interleaving blocks Int2_0, Int2_1, . . . , Int2_S2-1. Each second-stage interleaving block is read out, column by column with a respective columns permutation function, and the data samples are transmitted on their respective physical channel phc_0, phc_1, . . . , phc_S2-1, and over the air interface 6.

The data corresponding to one column of every (active) transport channel is transmitted in a so-called radio frame by the S2-1 physical channels. Hence, for a given transport channel interleaver it takes a number of interleaver columns worth of radio frames to transmit all the data belonging to that transport channel (along with the data of the other transport channels).

The de-interleaving system 1 receives the data samples respectively on the corresponding physical channels phc_0, phc_1, . . . , phc_S2-1. With the method according to the invention, it is possible to avoid using a classical two-stage de-interleaving device, which uses S1+S2 memory elements with explicit deinterleaving, and to calculate, for data samples received by the S2 physical channels, their respective rank in the de-interleaved sequences to output in the respective S1 output transport channels otc_0, otc_1, . . . , otc_S1-1 corresponding to the initial sequences received by the S1 initial transport channels itc_0, itc_1, . . . , itc_S1-1. Description of calculating the data rank is done later in the description, referring in particular to the following figure.

FIG. 3 describes more precisely the data-routing predetermined functions inter-stage 5, in a two-stage multi-interleaving device, according to the 3GPP standard, with predetermined data-routing functions corresponding. The S1 first-stage interleaving blocks Int1_0, Int1_1, . . . , Int1_S1-1 are represented on a first line. Predetermined concatenation functions read cyclically and concatenating, in an order determined by predetermined initial transport channels permutation functions, a column of respective first-stage interleaving blocks, the order of the reading of the columns in a determined first-stage interleaving block is determined by respective predetermined columns permutation functions of the first-stage interleavers. Predetermined padding functions are padding the concatenated data samples with NDTX padding data samples for obtaining a predetermined number of concatenated data samples.

Then the predetermined number of concatenated data samples is segmented by determined segmentation functions and padded with padding per segment functions, in predetermined size segments based on predetermined size U depending on the considered physical channel.

The number of the so-called filler bits is simply given by the difference of the dimension of the second-stage interleaver and U, where the last row of the second-stage interleaver can contain up to (column-1) filler bits.

In the 3GPP standard, the size U is the same for each physical channel. Then, data samples stored in the second-stage interleaving blocks are transmitted by corresponding physical channels, with second columns permutation functions. Of course, the de-interleaving system is able to process data samples with unpadding functions.

Figure 4:
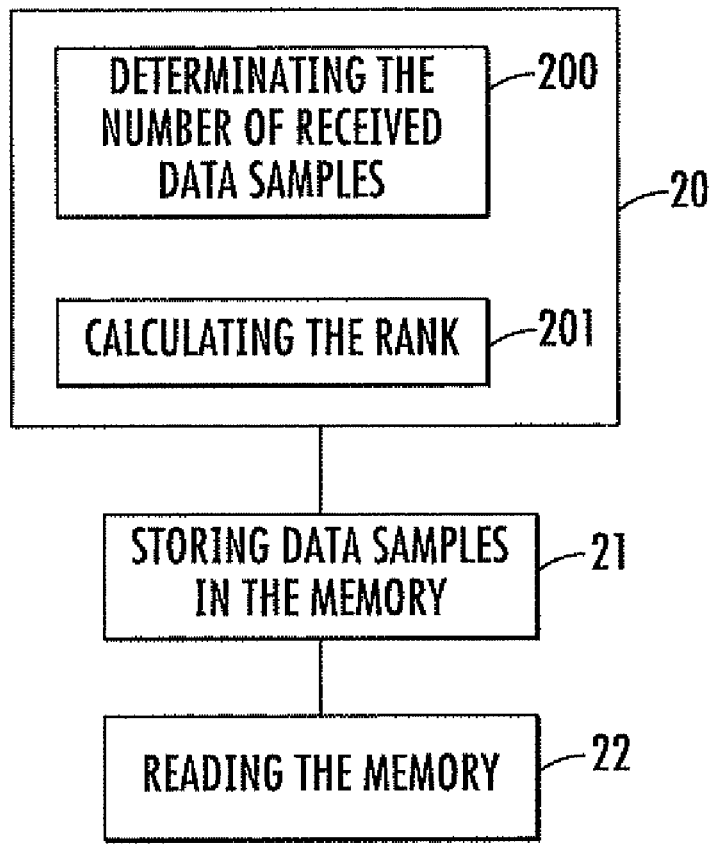
FIG. 4 illustrates the main steps of a method of de-interleaving according to the invention.
Figure 5:
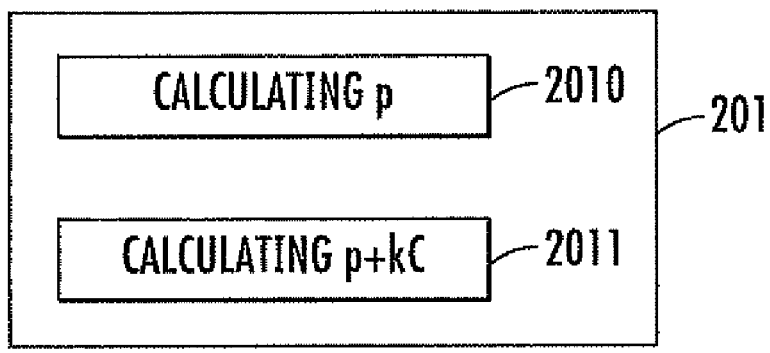
FIG. 5 illustrates in more detail a step of rank calculation according to the invention.

With reference to FIGS. 4 and 5 in particular, the method according to the invention will now be discussed in greater detail, which includes calculating directly the rank of data samples received by the de-interleaving system 1. The method comprises (step 20, FIG. 4) determining (step 200, FIG. 4), for each output transport channel the number $N_{s_2}^{col(s_1)}$ of received data samples of a sequence belonging to the output transport channel, and calculating (step 201, FIG. 4) for data samples received by a determined transport channel and intended for a determined output transport channel, their rank in the sequence output by the determined output transport channel. The sequence output is identical to the sequence received by the corresponding initial transport channel.

The step of calculating the rank (step 201) of a data sample is done with the formula:

$p(n_2,n_1,s_2,s_1)+k \times C(s_1,s_2)$, (step 2011, FIG. 5) such that $p(n_2,n_1,s_2,s_1)+k \times C(s_1,s_2) < F_{s_2}^{col(s_1)}$ wherein:

$s_2$ specifies the range of second-stage interleaving blocks and the range of physical channels, $s_2 \in \{0,1, \ldots, S2-1\}$;

$s_1$ specifies the range of first-stage interleaving blocks and the range of initial transport channels, $s_1 \in \{0,1, \ldots, S1-1\}$;

$n_1$ specifies the column range of the column of the first-stage interleaving block, with range s1, taking into account the predetermined initial transport channels permutation functions given a concatenation order col(s1), which has stored the data sample, $n_1 \in \{0, 1, \ldots, C_1^{col(s_1)}\}$ and $C_1^{col(s_1)}$ is the number of columns of the first-stage interleaving block having the range col(s1)th;

$n_2$ specifies the column range of the column of the second-stage interleaving block, with range $s_2$, which has stored the data sample, $n_2 \in \{0, 1, \ldots, C_2^{s_2}\}$ and $C_2^{s_2}$ is the number of columns of the second-stage interleaving block having the range $s_2$, which is the same C2 for each physical channel, in the 3GPP standard;

p is a phase term depending from the number of columns of the interleaving block of the second stage associated to the considered physical channel, the number of columns of the interleaving block of the first stage of the initial transport channel corresponding to the considered output transport channel, a first permutation function of columns of the interleaving block of the first stage of the initial transport channel corresponding to the considered output transport channel, a second permutation of columns of the interleaving block of the second stage of the physical channel, and the predetermined value U; and $F_{s_2}^{col(s_1)}$ specifies the number of data samples of the col (s1)th column of the current first-stage interleaving block in the $s_{2th}$ physical channel.

For the current data sample processed, $n_2$, $n_1$, $s_2$, $s_1$ are determined, and the value of the corresponding k is known, because k is an incremental value varying from 0 to $N_{s_2}^{col(s_1)}-1$.

In this formula, $C(s_1,s_2)$ is defined by $C(s1,s_2)=C_1^{col(s_1)} \times C_2^{s_2}$ and in the 3GPP standard by $C(s_1,s_2)=C_1^{col(s_1)} \times C_{s_2}$, i.e., the number of columns of the physical channel interleaver is the same for all the channels.

The term phase p is calculated (step 2010, FIG. 5) with the formula:

$$p(n_2,n_1,s_2,s_1) = p_1^{col(s_1)}(n_1) + E_{col(s_1)}^{s_2} \cdot C_1^{col(s_1)} + \mod(p_2(n_2) + C_2^{s_2} - M_{s_2}^{col(s_1)}, C_2^{s_2}) \cdot C_1^{col(s_1)}$$

which is for the 3GPP standard:

$$p(n_2,n_1,s_2,s_1) = p_1^{col(s_1)}(n_1) + E_{col(s_1)}^{s_2} \cdot C_1^{col(s_1)} + \mod(p_2(n_2) + C_2 - M_{s_2}^{col(s_1)}, C_2) \cdot C_1^{col(s_1)}$$

The term mod means the function modulo.

$F_{s_2}^{col(s_1)}$, which specifies the number of data samples of the col(s1)th column of the current first-stage interleaving block in the $s_{2th}$ physical channel is defined as follows:
$\forall s_1, s_2$ (regardless of the values of $s_1$ and $s_2$)

$$F_{s_2}^{col(s_1)} = \begin{cases} \min\left(\sum_{j=0}^{s_1} R_1^{col(j)}, R_1^{col(s_1)}\right) - (s_2+1) \cdot U & \text{if } (s_2+1) \cdot U > \sum_{j=0}^{s_1-1} R_1^{col(j)} > q \cdot U \\ \min\left(\sum_{j=0}^{s_1} R_1^{col(j)} - q \cdot U, R_1^{col(s_1)}\right) & \text{if } (s_2+1) \cdot U > \sum_{j=0}^{s_1} R_1^{col(j)} > q \cdot U \\ \min(U, R_1^{col(s_1)}) & \text{if } \sum_{j=0}^{s_1-1} R_1^{col(j)} \leq (s_2+1) \cdot U \leq \sum_{j=0}^{s_1} R_1^{col(j)} \\ 0 & \text{otherwise} \end{cases}$$

wherein the term min represents the minimum function, and $R_1^{col(j)}$ represents the number of rows of the first-stage interleaving block having the range col(j).

Furthermore, $$E_{s_2}^{col(s_1)} = \sum_{j=0}^{s_2-1} F_j^{col(s_1)}$$

takes into account the precedent data samples of the current column n1 which are intended for a physical channel with a precedent range and can be interpreted as a "rank" offset.

The number $N_{s_2}^{col(s_1)}$ determines the number of received data samples by the current physical channel with a range $s_2$ belonging to the current output transport channel. (step 200)

$$N_{s_2}^{col(s_1)} = \left\lceil \frac{F_{s_2}^{col(s_1)}}{C_2^{s_2}} \right\rceil,$$

which is in the 3GPP standard $$N_{s_2}^{col(s_1)} = \left\lceil \frac{F_{s_2}^{col(s_1)}}{C_2} \right\rceil,$$

wherein $\lceil \ \rceil$ represents the superior integer part function.

Furthermore, $M_{s_2}^{col(s_1)} = \mod(F_{s_2}^{col(s_1-1)}, C_2^{s_2})$ where $F_{s_2}^{col(s_1-1)}(-1)=0$, which is in 3GPP standard $M_{s_2}^{col(s_1)} = \mod(F_{s_2}^{col(s_1-1)}, C_2)$.

The determination of $N_{s_2}^{col(s_1)}$ is done by the determining unit 8, and the ranks of the data samples are calculated by the calculating unit 9. A predetermined processing order is used to increment the above-mentioned indexes: regardless of the value of n1, ($\forall n1$), the first incremented index is k, then the second incremented index is $s_1$, then the third incremented index is $n_2$, and then the fourth incremented index is $s_2$.

In other words an implementation respects this algorithm:

```
∀n₁
    for s₂ from 0 to S2 – 1 do
        for n₂ from 0 to C₂^s² – 1 (C₂ – 1 in 3GPP
        standard) do
            for s₁ from 0 to S1 – 1 do
                determination of N_s₂^col(s1)
                estimation of the phase term
                p(n₂,n₁,s₂,s₁)
                for k from 0 go N_s₂^col(s1) – 1 do
                    calculating the rank
                    p(n₂,n₁,s₂,s₁)+k × C(s₁,s₂)
                    as above-mentioned
                end do
            end for
        end do
    end for
end do
end for
```

Then, the method comprises storing (step 21, FIG. 4) each data for which its rank has been calculated in a memory element me_0, me_1, . . . , me_S1-1 associated with the corresponding output transport channel. This takes into account its calculated rank. Finally, when all the S2 received sequences have been processed, each memory element me_0, me_1, . . . , me_S1-1 is read (step 22, FIG. 4) such that the stored data samples are successively read in the same order as the order of the initial sequences of ordered data samples.

The invention advantageously allows memory size to be reduced up to 30% in the de-interleaving system for the so-called 384 kbps UE Capability Class as defined in the 3GPP standard. Moreover, the switching power consumption is greatly reduced due to fewer memory accesses. The invention also allows transforming a multi-stage de-interleaving system in a one-stage de-interleaving system.

That which is claimed is:

1. A method for de-interleaving S2 received sequences of interleaved received data samples respectively issued from S2 physical channels and to be associated with S1 output transport channels, the S2 received sequences having been delivered, before transmission by a two-stage multi-interleaving device, from S1 initial sequences of ordered data samples respectively associated to S1 initial transport channels, the two-stage multi-interleaving device comprising a first stage including S1 interleaving blocks respectively associated with the S1 initial transport channels, a second stage including S2 interleaving blocks respectively associated with the S2 physical channels and an inter-stage of predetermined data-routing functions connected between the first and second stages, the method comprising:

a) for each of the S2 received sequences, determining for each output transport channel a number $N_{s_2}^{col(s_1)}$ of received data samples of the sequence belonging to the output transport channel, and calculating for each received data sample belonging to the output transport channel, its rank in the sequence of data samples associated with the output transport channel, the rank being identical to the rank of the corresponding data sample in a corresponding initial sequence associated with the corresponding initial transport channel, where $s_1$ specifies a range of first stage interleaving blocks and a range of initial transport channels, $s_2$ specifies a range of second stage interleaving blocks and a range of physical channels, and $col(s_1)$ corresponds to a number of columns of the second stage interleaving blocks, the calculating comprising for the number $N_{s_2}^{col(s_1)}$ of data samples belonging to a considered output transport channel, calculating a value C and a phase term p, which are constant for the number $N_{s_2}^{col(s_1)}$ of data samples, the value C being equal to the product of the number of columns of the interleaving block of the second stage associated with a considered physical channel and of the number of columns of the interleaving block of the first stage of the initial transport channel corresponding to a considered output transport channel, and the phase term p depending from the number of columns of the interleaving block of the second stage associated with the considered physical channel, the number of columns of the interleaving block of the first stage of the initial transport channel corresponding to the considered output transport channel, a first permutation function of columns of the interleaving block of the first stage of the initial transport channel corresponding to the considered output transport channel, a second permutation of columns of the interleaving block of the second stage of the physical channel, and of the predetermined value U;

b) storing each data for which its rank has been calculated, in a memory element associated with the corresponding output transport channel, taking into account its calculated rank; and c) when all the S2 received sequences have been processed, reading each memory element such that stored data samples are successively read in the same order as the order of the initial sequences of ordered data samples.

2. A method according to claim 1, wherein the number $N_{s_2}^{col(s_1)}$ is determined from data including the number of columns of the interleaving block of the second stage associated with a considered physical channel, the number of rows of the interleaving block of the first stage of the initial transport channel corresponding to a considered output transport channel and a predetermined value U associated with each physical channel, the determining comprising taking into account a concatenation order of the initial transport channels.

3. A method according to claim 1, wherein the rank of a data sample is equal to p+k*C, where k is an incremental value varying from 0 to $N_{s_2}^{col(s_1)}-1$.

4. A method according to claim 1, wherein the interleaving and de-interleaving are performed according to the 3GPP standard, and wherein the predetermined inter-stage data-routing functions comprise columns permutation functions, initial transport channels permutation functions, segmentation functions, concatenation functions, padding functions, and unpadding functions.

5. A de-interleaving system for de-interleaving S2 received sequences of interleaved received data samples respectively issued from S2 physical channels and to be associated with S1 output transport channels, the S2 received sequences having been delivered, before transmission by a two-stage multi-interleaving device, from S1 initial sequences of ordered data samples respectively associated with S1 initial transport channels, the two-stage multi-interleaving device comprising a first stage including S1 interleaving blocks respectively associated with the S1 initial transport channels, a second stage including S2 interleaving blocks respectively associated with the S2 physical channels and an inter-stage of predetermined data-routing functions connected between the first and second stages, the system comprising:

a processor comprising a determining module for determining, for each of the S2 received sequences and for each output transport channel, a number $N_{s_2}^{col(s_1)}$ of received data samples of the sequence belonging to the output transport channel, and a calculating module for calculating, for each of the S2 received sequences, and for each received data sample belonging to the output transport channel, its rank in the sequence of data samples associated with the output transport channel, the rank being identical to the rank of the corresponding data sample in a corresponding initial sequence associated with the corresponding initial transport channel, where $s_1$ specifies a range of first stage interleaving blocks and a range of initial transport channels, $s_2$ specifies a range of second stage interleaving blocks and a range of physical channels, and $col(s_1)$ corresponds to a number of columns of the second stage interleaving blocks;

said calculating module calculating a value C and a phase term p, which are constant for the number $N_{s_2}^{col(s_1)}$ of data samples, the value C being equal to the product of the number of columns of the interleaving block of the second stage associated with a considered physical channel and of the number of columns of the interleaving block of the first stage of the initial transport channel corresponding to a considered output transport channel, and the phase term p depending from the number of columns of the interleaving block of the second stage associated with the considered physical channel, the number of columns of the interleaving block of the first stage of the initial transport channel corresponding to the considered output transport channel, a first permutation function of columns of the interleaving block of the first stage of the initial transport channel corresponding to the considered output transport channel, a second permutation of columns of the interleaving block of the second stage of the physical channel, and of the predetermined value U;

S1 memory elements respectively associated with the S1 output transport channels;

a storing circuit for storing each data for which its rank has been calculated, in said memory element associated with the corresponding output transport channel; and a reading circuit for reading, when all the S2 received sequences have been processed, each memory element such that stored data samples are successively read in the same order as the order of the initial sequences of ordered data samples.

6. A de-interleaving system according to claim 5, wherein said determining module determines the number $N_{s_2}^{col(s_1)}$ from data including the number of columns of the interleaving block of the second stage associated with a considered physical channel, the number of rows of the interleaving block of the first stage of the initial transport channel corresponding to a considered output transport channel and a predetermined value U associated to each physical channel, said determining module taking into account a concatenation order of the initial transport channels.

7. A de-interleaving system according to claim 5, wherein said calculating module calculates the rank of a data sample equal to $p+k*C$, where k is an incremental counter varying from 0 to $N_{s_2}^{col(s_1)}-1$.

8. A de-interleaving system according to claim 5, wherein the system performs according to the 3GPP standard for interleaving and de-interleaving, with inter-stage data-routing functions comprising columns permutation functions, initial transport channels permutation functions, segmentation functions, concatenation functions, padding functions, and unpadding functions.

9. A system comprising:

a two-stage multi-interleaving device delivering S2 sequences of interleaved data samples respectively issued from S2 physical channels and to be associated with S1 output transport channels from S1 initial sequences of ordered data samples respectively associated to S1 initial transport channels, said two-stage multi-interleaving device comprising a first stage including S1 interleaving blocks, respectively associated with the S1 initial transport channels, a second stage including S2 interleaving blocks respectively associated with the S2 physical channels, and an inter-stage of predetermined data-routing functions connected between said first and second stages; and a de-interleaving device for de-interleaving the S2 received sequences and comprising a processor comprising a determining module for determining, for each of the S2 received sequences, and for each output transport channel, a number $N_{s_2}^{col(s_1)}$ of received data samples of the sequence belonging to the output transport channel, and a calculating module for calculating, for each of the S2 received sequences, and for each received data sample belonging to the output transport channel, its rank in the sequence of data samples associated with the output transport channel, the rank being identical to the rank of the corresponding data sample in a corresponding initial sequence associated with the corresponding initial transport channel, where $s_1$ specifies a range of first stage interleaving blocks and a range of initial transport channels, $s_2$ specifies a range of second stage interleaving blocks and a range of physical channels, and $col(s_1)$ corresponds to a number of columns of the second stage interleaving blocks, S1 memory elements respectively associated to the S1 output transport channels, a storing circuit for storing each data for which its rank has been calculated, in said memory element associated with the corresponding output transport channel, and a reading circuit for reading, when all the S2 received sequences have been processed, each memory element such that stored data samples are successively read in the same order as the order of the initial sequences of ordered data samples, said calculating module calculating a value C and a phase term p, which are constant for the number $N_{s_2}^{col(s_1)}$ of data samples, the value C being equal to the product of the number of columns of the interleaving block of the second stage associated with a considered physical channel and of the number of columns of the interleaving block of the first stage of the initial transport channel corresponding to a considered output transport channel, and the phase term p depending from the number of columns of the interleaving block of the second stage associated with the considered physical channel, the number of columns of the interleaving block of the first stage of the initial transport channel corresponding to the considered output transport channel, a first permutation function of columns of the interleaving block of the first stage of the initial transport channel corresponding to the considered output transport channel, a second permutation of columns of the interleaving block of the second stage of the physical channel, and of the predetermined value U.

10. A system according to claim 9, wherein said determining module determines the number $N_{s_2}^{col(s_1)}$ from data including the number of columns of the interleaving block of the second stage associated with a considered physical channel, the number of rows of the interleaving block of the first stage of the initial transport channel corresponding to a considered output transport channel and a predetermined value U associated to each physical channel, said determining module taking into account a concatenation order of the initial transport channels.

11. A system according to claim 9, wherein said calculating module calculates the rank of a data sample equal to $p+k*C$, where k is an incremental counter varying from 0 to $N_{s_2}^{col(s_1)}-1$.

12. A system according to claim 9, wherein the system performs according to the 3GPP standard for interleaving and de-interleaving, with inter-stage data-routing functions comprising columns permutation functions, initial transport channels permutation functions, segmentation functions, concatenation functions, padding functions, and unpadding functions.

13. A cellular mobile phone comprising:

a radio frequency (RF) stage for receiving interlaced data samples; and a de-interleaving device connected to said RF stage for de-interleaving S2 received sequences of interleaved received data samples respectively issued from S2 physical channels and to be associated with S1 output transport channels, the S2 received sequences having been delivered, before transmission, by a two-stage multi-interleaving device, from S1 initial sequences of ordered data samples respectively associated to S1 initial transport channels, the two-stage multi-interleaving device comprising a first stage including S1 interleaving blocks respectively associated to the S1 initial transport channels, a second stage including S2 interleaving blocks respectively associated to the S2 physical channels and an inter-stage of predetermined data-routing functions connected between the first and second stages, said de-interleaving device comprising a processor comprising a determining module for determining, for each of the S2 received sequences, and for each output transport channel, a number $N_{s_2}^{col(s_1)}$ of received data samples of the sequence belonging to the output transport channel, and a calculating module for calculating, for each of the S2 received sequences, and for each received data sample belonging to the output transport channel, its rank in the sequence of data samples associated with the output transport channel, the rank being identical to the rank of the corresponding data sample in a corresponding initial sequence associated with the corresponding initial transport channel, where $s_1$ specifies a range of first stage interleaving blocks and a range of initial transport channels, $s_2$ specifies a range of second stage interleaving blocks and a range of physical channels, and $col(s_1)$ corresponds to a number of columns of the second stage interleaving blocks, S1 memory elements respectively associated with the S1 output transport channels, a storing circuit for storing each data for which its rank has been calculated, in said memory element associated with the corresponding output transport channel, and a reading circuit for reading, when all the S2 received sequences have been processed, each memory element such that stored data samples are successively read in the same order as the order of the initial sequences of ordered data samples, said calculating module calculating a value C and a phase term p, which are constant for the number $N_{s_2}^{col(s_1)}$ of data samples, the value C being equal to the product of the number of columns of the interleaving block of the second stage associated with a considered physical channel and of the number of columns of the interleaving block of the first stage of the initial transport channel corresponding to a considered output transport channel, and the phase term p depending from the number of columns of the interleaving block of the second stage associated with the considered physical channel, the number of columns of the interleaving block of the first stage of the initial transport channel corresponding to the considered output transport channel, a first permutation function of columns of the interleaving block of the first stage of the initial transport channel corresponding to the considered output transport channel, a second permutation of columns of the interleaving block of the second stage of the physical channel, and of the predetermined value U.

14. A cellular mobile phone according to claim 13, wherein said determining module determines the number $N_{s_2}^{col(s_1)}$ from data including the number of columns of the interleaving block of the second stage associated with a considered physical channel, the number of rows of the interleaving block of the first stage of the initial transport channel corresponding to a considered output transport channel and a predetermined value U associated to each physical channel, said determining module taking into account a concatenation order of the initial transport channels.

15. A cellular mobile phone according to claim 13, wherein said calculating module calculates the rank of a data sample equal to p+k*C, where k is an incremental counter varying from 0 to $N_{s_2}^{col(s_1)}-1$.

16. A cellular mobile phone according to claim 13, wherein the system performs according to the 3GPP standard for interleaving and de-interleaving, with inter-stage data-routing functions comprising columns permutation functions, initial transport channels permutation functions, segmentation functions, concatenation functions, padding functions, and unpadding functions.

* * * * *